US009224977B2

(12) United States Patent
Ookawara et al.

(10) Patent No.: US 9,224,977 B2
(45) Date of Patent: Dec. 29, 2015

(54) METHOD OF MANUFACTURING ORGANIC ELECTROLUMINESCENT DISPLAY DEVICE

(71) Applicant: Japan Display Inc., Tokyo (JP)

(72) Inventors: Takeshi Ookawara, Tokyo (JP); Hirotsugu Sakamoto, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/497,378

(22) Filed: Sep. 26, 2014

(65) Prior Publication Data

US 2015/0093845 A1 Apr. 2, 2015

(30) Foreign Application Priority Data

Sep. 27, 2013 (JP) ................................ 2013-202359

(51) Int. Cl.
*H01L 51/56* (2006.01)
*H01L 27/32* (2006.01)
*H01L 51/52* (2006.01)

(52) U.S. Cl.
CPC ......... *H01L 51/5221* (2013.01); *H01L 27/3276* (2013.01); *H01L 51/56* (2013.01); *H01L 2251/566* (2013.01)

(58) Field of Classification Search
CPC ................ H01L 51/56; H01L 51/5221; H01L 2251/566; H01L 27/3276
USPC ..................................... 438/34; 257/E51.019
See application file for complete search history.

(56) References Cited

U.S. PATENT DOCUMENTS

| 6,348,359 | B1 * | 2/2002 | Van Slyke et al. ............... 438/29 |
| 6,770,562 | B2 * | 8/2004 | Yamazaki et al. ............ 438/679 |
| 6,948,993 | B2 * | 9/2005 | Yi et al. ........................... 445/24 |
| 7,482,631 | B2 * | 1/2009 | Yamazaki et al. ............. 438/679 |
| 7,618,674 | B2 * | 11/2009 | Kang et al. ....................... 427/66 |
| 7,718,476 | B2 * | 5/2010 | Lee et al. ....................... 438/149 |
| 7,744,719 | B2 * | 6/2010 | Kim et al. ...................... 156/295 |
| 7,800,100 | B2 * | 9/2010 | Lee et al. ......................... 257/40 |
| 7,802,537 | B2 * | 9/2010 | Kang ............................. 118/504 |
| 7,833,570 | B2 * | 11/2010 | Harkleroad et al. ............. 427/66 |
| 7,915,073 | B2 * | 3/2011 | Matsuzaki et al. ............... 438/99 |
| 7,948,171 | B2 * | 5/2011 | Sakakura et al. ............. 313/506 |
| 7,951,631 | B2 * | 5/2011 | Jeon et al. .......................... 430/5 |
| 7,972,442 | B2 * | 7/2011 | Vaccaro ......................... 118/720 |

(Continued)

FOREIGN PATENT DOCUMENTS

JP 2010-244696 A 10/2010
WO WO 2013/026493 * 2/2013 .............. C23C 14/04

*Primary Examiner* — Mary Wilczewski
(74) *Attorney, Agent, or Firm* — Lowe Hauptman & Ham, LLP

(57) ABSTRACT

A method of manufacturing an organic electroluminescent display device of the invention includes the steps of: forming, on a mother substrate including display regions and terminal forming regions, an upper electrode in each of the display regions; and cutting the mother substrate along each border between the display regions to thereby divide the mother substrate into a plurality of individual pieces. The step of forming the upper electrode includes the step of depositing a material of the upper electrode in the display regions using a mask including a frame-shaped frame and stripe-shaped shielding portions that cover regions corresponding to the terminal forming regions. The shielding portion is fixed in a state where the shielding portion spans between facing sides of the frame and tension in one direction is applied, and extends only in the one direction inside an inner periphery of the frame in a plan view.

2 Claims, 11 Drawing Sheets

(56) References Cited

U.S. PATENT DOCUMENTS

| | | | |
|---|---|---|---|
| 8,120,248 B2* | 2/2012 | Shinto et al. | 313/506 |
| 8,349,194 B2* | 1/2013 | Paek et al. | 216/13 |
| 8,402,917 B2* | 3/2013 | Ko et al. | 118/506 |
| 8,604,489 B2* | 12/2013 | Hong et al. | 257/88 |
| 8,609,442 B2* | 12/2013 | Inoue et al. | 438/5 |
| 8,631,761 B2* | 1/2014 | Kang | 118/504 |
| 8,658,545 B2* | 2/2014 | Kawato et al. | 438/758 |
| 8,669,192 B2* | 3/2014 | Kawato et al. | 438/758 |
| 8,701,592 B2* | 4/2014 | Ko et al. | 118/504 |
| 8,729,570 B2* | 5/2014 | Lee et al. | 257/88 |
| 8,816,349 B2* | 8/2014 | Yamazaki et al. | 257/72 |
| 8,841,142 B2* | 9/2014 | Kawato et al. | 438/14 |
| 8,852,346 B2* | 10/2014 | Lee | 118/720 |
| 8,859,438 B2* | 10/2014 | Sonoda et al. | 438/758 |
| 8,881,676 B2* | 11/2014 | Hong | 118/504 |
| 8,895,967 B2* | 11/2014 | Kim et al. | 257/40 |
| 8,906,718 B2* | 12/2014 | Sonoda et al. | 438/29 |
| 8,907,445 B2* | 12/2014 | Sonoda et al. | 257/526 |
| 8,951,891 B2* | 2/2015 | Ro et al. | 438/466 |
| 2003/0221620 A1* | 12/2003 | Yamazaki | 118/722 |
| 2007/0024182 A1* | 2/2007 | Lee et al. | 313/500 |
| 2007/0134567 A1* | 6/2007 | Park et al. | 430/5 |
| 2007/0178225 A1* | 8/2007 | Takanosu et al. | 427/69 |
| 2007/0194699 A1* | 8/2007 | Lee et al. | 313/505 |
| 2008/0118743 A1* | 5/2008 | Lee et al. | 428/332 |
| 2010/0055810 A1* | 3/2010 | Sung et al. | 438/22 |
| 2010/0188388 A1* | 7/2010 | Lee et al. | 345/211 |
| 2011/0185561 A1* | 8/2011 | Landgraf et al. | 29/446 |
| 2011/0185965 A1* | 8/2011 | Park et al. | 118/504 |
| 2011/0185966 A1* | 8/2011 | Lee et al. | 118/504 |
| 2012/0268813 A1* | 10/2012 | Kim et al. | 359/450 |
| 2012/0301614 A1* | 11/2012 | Choi et al. | 427/255.5 |
| 2012/0301986 A1* | 11/2012 | Choi et al. | 438/34 |
| 2013/0017320 A1* | 1/2013 | Sonoda et al. | 427/66 |
| 2013/0048991 A1* | 2/2013 | Nakadaira | 257/59 |
| 2013/0059063 A1* | 3/2013 | Kawato et al. | 427/66 |
| 2013/0064969 A1* | 3/2013 | Inoue et al. | 427/66 |
| 2013/0205568 A1* | 8/2013 | Ko et al. | 29/458 |
| 2013/0240870 A1* | 9/2013 | Kawato et al. | 257/40 |
| 2013/0316475 A1* | 11/2013 | Yu et al. | 438/26 |
| 2013/0337597 A1* | 12/2013 | Kawato et al. | 438/34 |
| 2014/0130733 A1* | 5/2014 | Han | 118/504 |
| 2014/0130734 A1* | 5/2014 | Lim et al. | 118/504 |
| 2014/0147949 A1* | 5/2014 | Hong et al. | 438/46 |
| 2014/0150721 A1* | 6/2014 | Oh et al. | 118/504 |
| 2014/0230219 A1* | 8/2014 | Lee | 29/428 |
| 2014/0283742 A1* | 9/2014 | Park et al. | 118/504 |
| 2014/0338599 A1* | 11/2014 | Kim | 118/721 |
| 2014/0357002 A1* | 12/2014 | Chung et al. | 438/34 |
| 2015/0004312 A1* | 1/2015 | Scheer et al. | 427/248.1 |
| 2015/0009483 A1* | 1/2015 | Kim | 355/76 |
| 2015/0013601 A1* | 1/2015 | Lee | 118/504 |
| 2015/0027367 A1* | 1/2015 | Hong | 118/505 |

* cited by examiner

METHOD OF MANUFACTURING ORGANIC ELECTROLUMINESCENT DISPLAY DEVICE

CROSS-REFERENCE TO RELATED APPLICATION

The present application claims priority from Japanese application JP 2013-202359 filed on Sep. 27, 2013, the content of which is hereby incorporated by reference into this application.

BACKGROUND OF THE INVENTION

1. Field of the Invention

The present invention relates to a method of manufacturing an organic electroluminescent display device.

2. Description of the Prior Art(s)

Organic electroluminescent light-emitting elements have attracted attention as thin and light-weight light-emitting sources, and image display devices including a number of organic electroluminescent light-emitting elements have been developed. The organic electroluminescent light-emitting element has a structure in which an organic layer including a light-emitting layer is interposed between a lower electrode and an upper electrode.

As a method of manufacturing such an organic electroluminescent light-emitting element, a method has been disclosed in which a film for an electrode is formed on a substrate using a deposition mask formed of metal foil attached to a frame. In a region of the metal foil inside the frame, a plurality of opening patterns are provided.

SUMMARY OF THE INVENTION

According to the manufacturing method using the deposition mask in the related art, tension from the frame is not applied to a portion of the metal foil at a region between an inner periphery of the frame and the opening of the metal foil. For this reason, there is a risk of deformation of this region due to a film stress of an electrode material adhered to the metal foil. For this reason, a failure may occur due to the metal foil contacting the substrate or the electrode, leading to a risk of a reduction in yield.

The invention has been made in view of the circumstances described above, and it is an object of the invention to realize a method of manufacturing an organic electroluminescent display device by which a reduction in yield can be suppressed.

(1) A method of manufacturing an organic electroluminescent display device according to an aspect of the invention includes the steps of: forming, on a mother substrate in which organic electroluminescent display device forming regions each including a display region and a terminal forming region are arranged in a matrix, a thin film transistor in each of the display regions; forming a lower electrode on the thin film transistor; forming, on the lower electrode, an organic layer including a light-emitting layer; forming an upper electrode on the organic layer; and cutting the mother substrate along each border between the display regions to thereby divide the mother substrate into a plurality of individual pieces, wherein the step of forming the upper electrode includes the step of depositing a material of the upper electrode in the display regions using a mask including a frame-shaped frame and stripe-shaped shielding portions that cover regions corresponding to the terminal forming regions, and the shielding portion is fixed in a state where the shielding portion spans between facing sides of the frame and tension in one direction is applied, and extends only in the one direction inside an inner periphery of the frame in a plan view.

(2) In the method of manufacturing the organic electroluminescent display device according to the aspect of the invention, the shielding portion may be formed by providing openings that extend in the one direction in a shielding member.

DETAILED DESCRIPTION OF THE INVENTION

Figure 1:
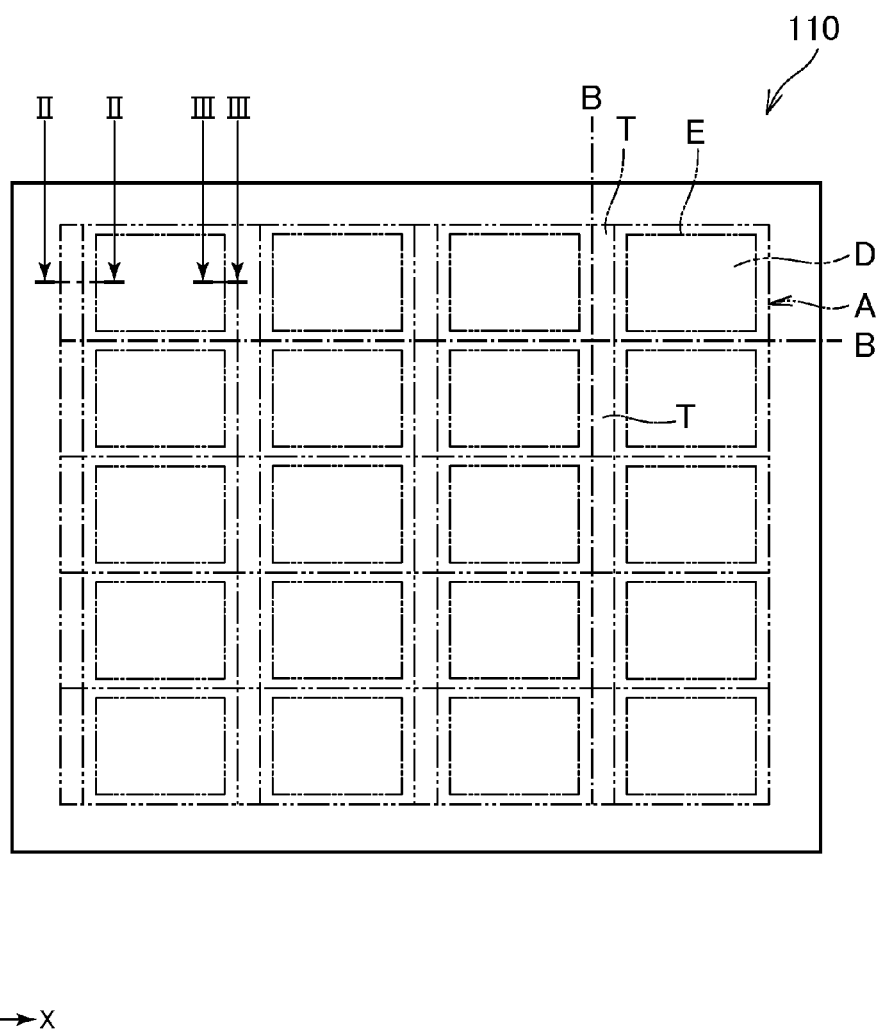
FIG. 1 is a schematic plan view of a mother substrate, showing a method of manufacturing an organic electroluminescent display device according to an embodiment of the invention.

Hereinafter, a method of manufacturing an organic electroluminescent display device according to an embodiment of the invention will be described based on the drawings. In the drawings referred to in the following description, a feature portion is shown in an enlarged manner in some cases for convenience sake for easy understanding of the feature. Therefore, the dimension ratio or the like of each component is not always the same as the actual component. Moreover, a material or the like illustrated in the following description is shown by way of example. Therefore, each component may be formed of a different material or the like from the illustrated one, and the invention can be implemented by changing the material or the like within a range not changing the gist of the invention.

FIG. 1 is a schematic plan view of a mother substrate 110, showing the method of manufacturing the organic electroluminescent display device according to the embodiment of the invention. First, the mother substrate 110 is prepared. The mother substrate 110 is an insulative substrate in which organic electroluminescent display device forming regions A are arranged in a matrix. The mother substrate 110 is cut along each border B between the organic electroluminescent display device forming regions A, and therefore serves as a substrate of an organic electroluminescent display device described later.

Each of the organic electroluminescent display device forming regions A is provided with a display region D in which pixels P described later are arranged in a matrix, a non-display region E that surrounds the periphery of each of the display regions D in a plan view, and a terminal forming region T as a place in which terminals are formed. The terminal forming regions T in the embodiment are contiguous in the Y-direction as shown in FIG. 1, for example.

Figure 2:
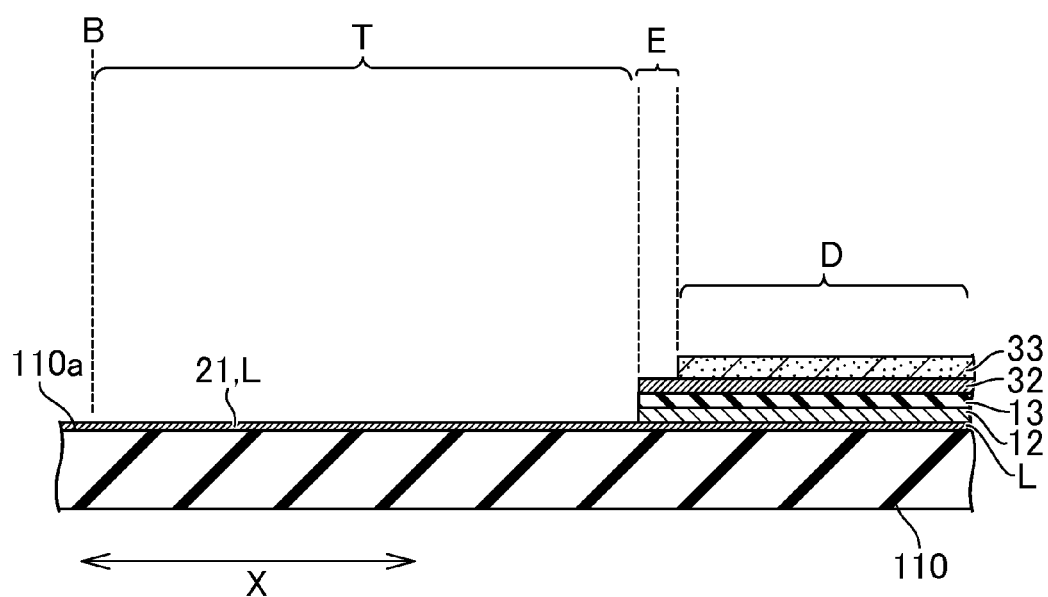
FIG. 2 is a schematic cross-sectional view of the mother substrate shown in FIG. 1 along the cut line II-II.
Figure 3:
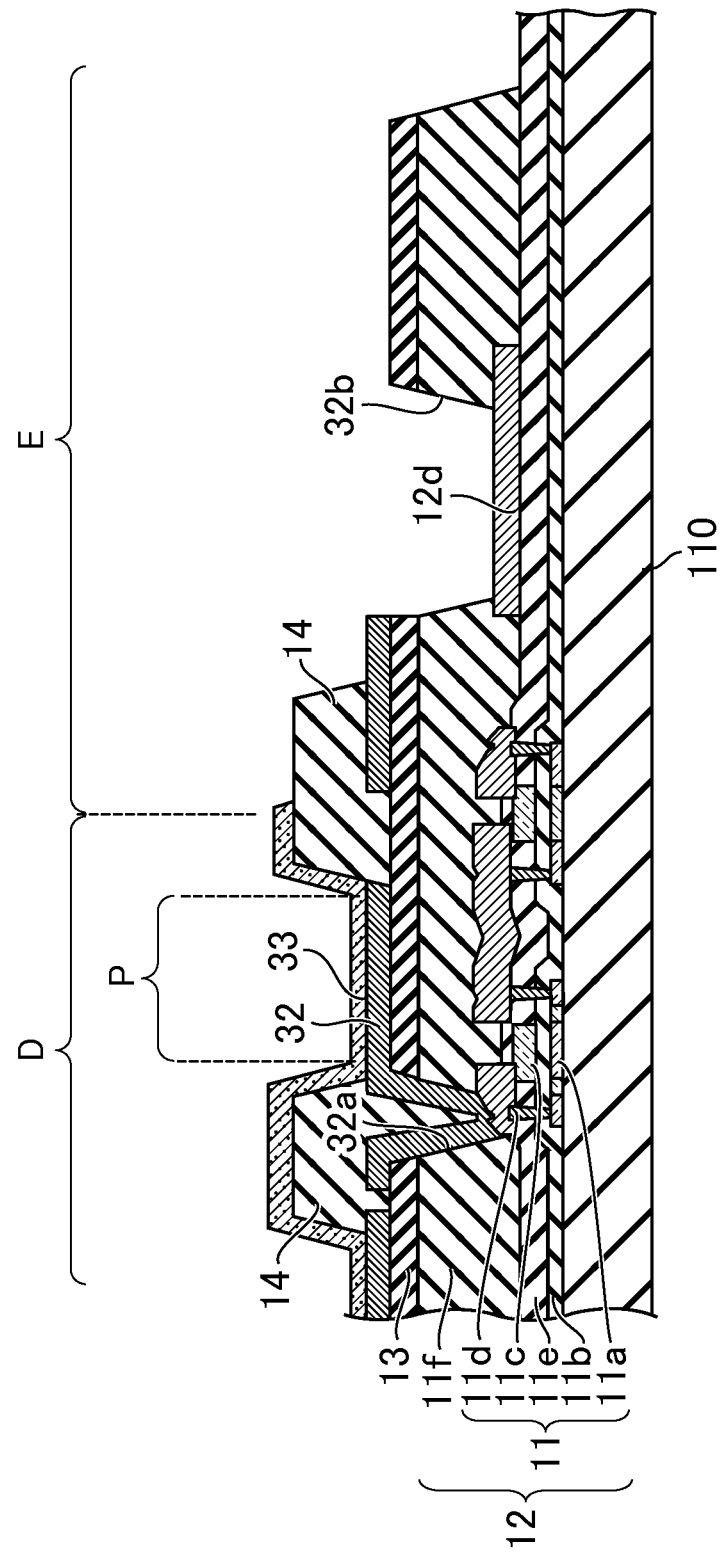
FIG. 3 is a schematic cross-sectional view of the mother substrate shown in FIG. 1 along the cut line III-III.

Next, as shown in FIGS. 2 and 3, terminals 21 and thin film transistors 11 are formed in each of the terminal forming regions T and in each of the display regions D, respectively, on the mother substrate 110. FIG. 2 is a schematic cross-sectional view of the mother substrate 110 shown in FIG. 1 along the cut line II-II. FIG. 3 is a schematic cross-sectional view of the mother substrate 110 shown in FIG. 1 along the cut line III-III.

First, as shown in FIG. 2, first wires L that extend in the X-direction are formed spaced apart from each other on an upper surface 110a of the mother substrate 110. A portion of the first wire L formed in the terminal forming region T is the terminal 21.

Next, as shown in FIG. 3, a polysilicon semiconductor layer 11a, a gate insulating layer 11b, a layer of a gate electrode 11c, a layer of a source-drain electrode 11d, and an inter-layer insulating film 11e are sequentially stacked in each of the display regions D on the mother substrate 110, and patterning is performed. Due to this, the thin film transistor 11 is formed for each of the pixels P in each of the display regions D of the mother substrate 110.

Moreover, in this step of forming the thin film transistor 11, a second wire 12d that is in the same layer as the source-drain electrode 11d is formed in the non-display region E.

Next, a passivation film 11f as an insulating film that protects the thin film transistors 11 is formed so as to cover the thin film transistors 11. Thus, a circuit layer 12 including the thin film transistors 11 and the passivation film 11f is formed.

Next, a planarization film 13 formed of, for example, an insulative material such as $SiO_2$, SiN, acrylic resin, or polyimide is formed so as to cover the circuit layer 12. By forming the planarization film 13 on the circuit layer 12 in this manner, the thin film transistors 11 adjacent to each other or the thin film transistor 11 and an organic electroluminescent light-emitting element 30 described later are electrically insulated from each other.

Next, a first contact hole 32a that penetrates through the planarization film 13 and the passivation film 11f and exposes a portion of an upper surface of the source-drain electrode 11d is formed for each of the pixels P in the display region D. Moreover, a second contact hole 32b that exposes a portion of an upper surface of the second wire 12d is formed in the non-display region E.

Next, the organic electroluminescent light-emitting element 30 is formed on the thin film transistor 11. A step of forming the organic electroluminescent light-emitting element 30 includes a step of forming a lower electrode 32, a step of forming, on the lower electrode 32, an organic layer 33 including a light-emitting layer, and a step of forming an upper electrode 34 on the organic layer 33.

First, the lower electrode 32 is formed so as to cover the planarization film 13 in the display region D. Due to this, the lower electrode 32 is electrically connected to the thin film transistor 11 via the first contact hole 32a in the display region D.

As the material of the lower electrode 32, specifically for example, ITO (Indium Tin Oxide) is preferably used. However, a light-transmissive and conductive material such as IZO (indium-zinc composite oxide), tin oxide, zinc oxide, indium oxide, or aluminum oxide composite oxide may be used.

Next, a pixel separation film 14 formed of an insulating material is formed along each border between the pixels P adjacent to each other in the display region D. Due to this, contact between the lower electrodes 32 adjacent to each other and a leakage current between the lower electrode 32 and the upper electrode 34 are suppressed.

Next, for example, a hole injection layer, a hole transport layer, a light-emitting layer, an electron transport layer, and an electron injection layer, all of which are not shown, are stacked so as to cover a plurality of the lower electrodes 32 and a plurality of the pixel separation films 14, whereby the organic layer 33 including at least the light-emitting layer is formed. The stacked structure of the organic layer 33 is not limited to that described herein, but may be other structure as long as the structure includes at least a light-emitting layer.

Figure 4:
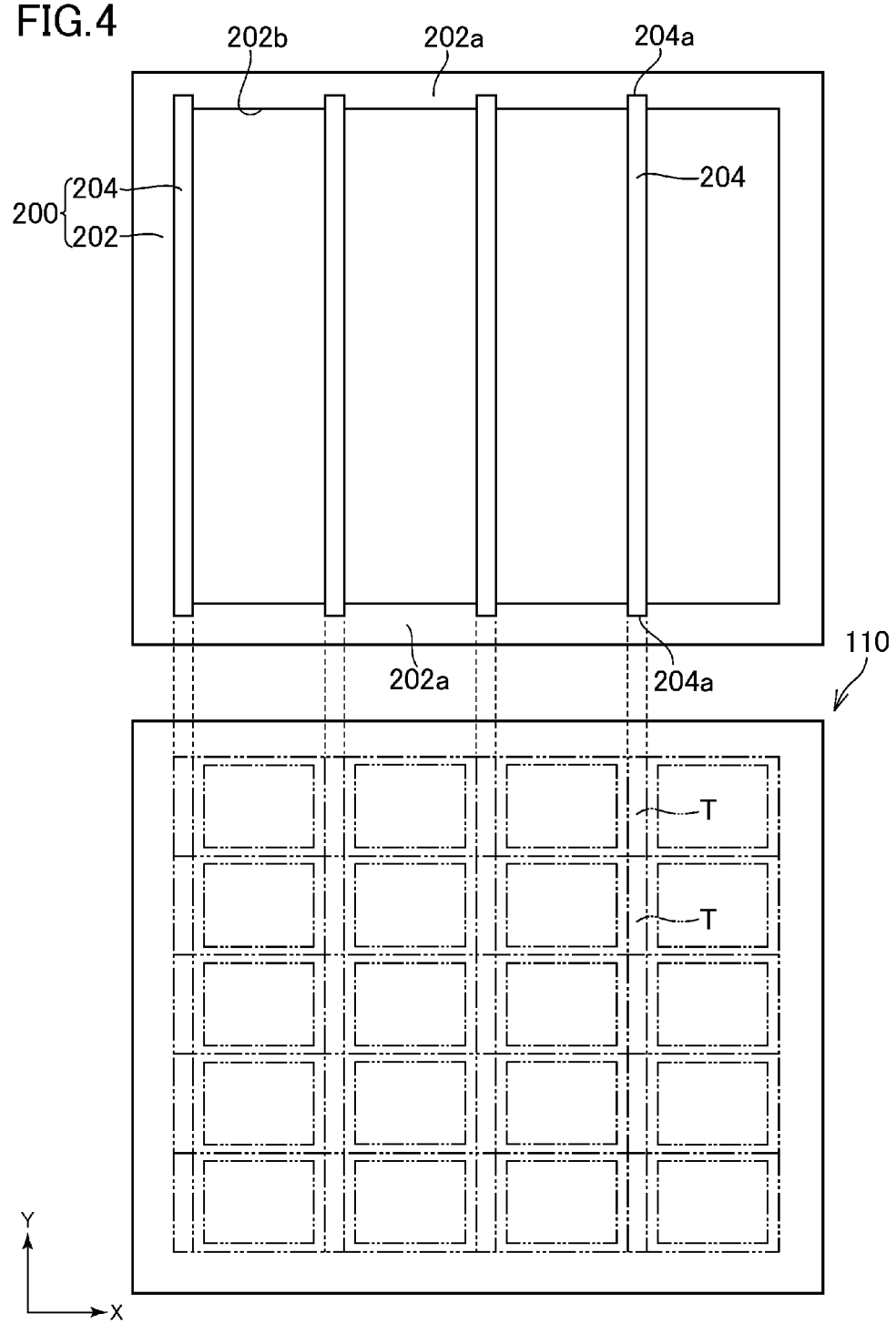
FIG. 4 is a schematic plan view showing an arrangement relation between a mask for depositing an upper electrode on the mother substrate and the mother substrate.

Next, the upper electrode 34 is formed on the organic layer 33. FIG. 4 is a schematic plan view showing an arrangement relation between a mask 200 for depositing the upper electrode 34 on the mother substrate 110 and the mother substrate 110. Hereinafter, the configuration of the mask 200 will be described in detail.

The mask 200 includes a frame-shaped frame 202 and stripe-shaped shielding portions 204 that cover regions corresponding to the terminal forming regions T of the mother substrate 110. The shielding portion 204 is formed of, for example, metal foil. The shielding portion 204 spans between facing sides 202a of the frame 202 with ends 204a of the shielding portion located on the facing sides. Due to this, the shielding portion 204 is fixed to the frame 202 in a state where tension in one direction (the Y-direction in the embodiment) is applied.

Due to this, a plurality of the shielding portions 204 extend only in one direction (the Y-direction) inside an inner periphery 202b of the frame 202 in the plan view, and are arranged spaced apart from each other in the X-direction. The shielding portions 204 are fixed to the frame 202 in this manner, whereby the inner periphery 202b of an opening composed of the shielding portions 204 and the frame 202 is formed over the plurality of display regions D.

Figure 5:
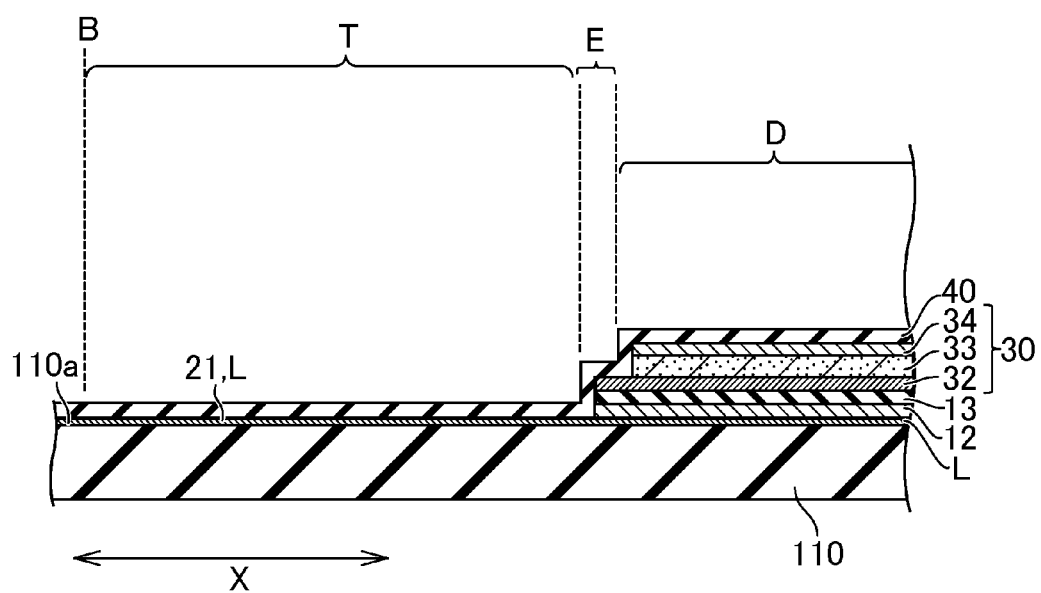
FIG. 5 is a schematic cross-sectional view showing the mother substrate shown in FIG. 1 in the same view as FIG. 2, showing the method of manufacturing the organic electroluminescent display device according to the embodiment of the invention.
Figure 6:
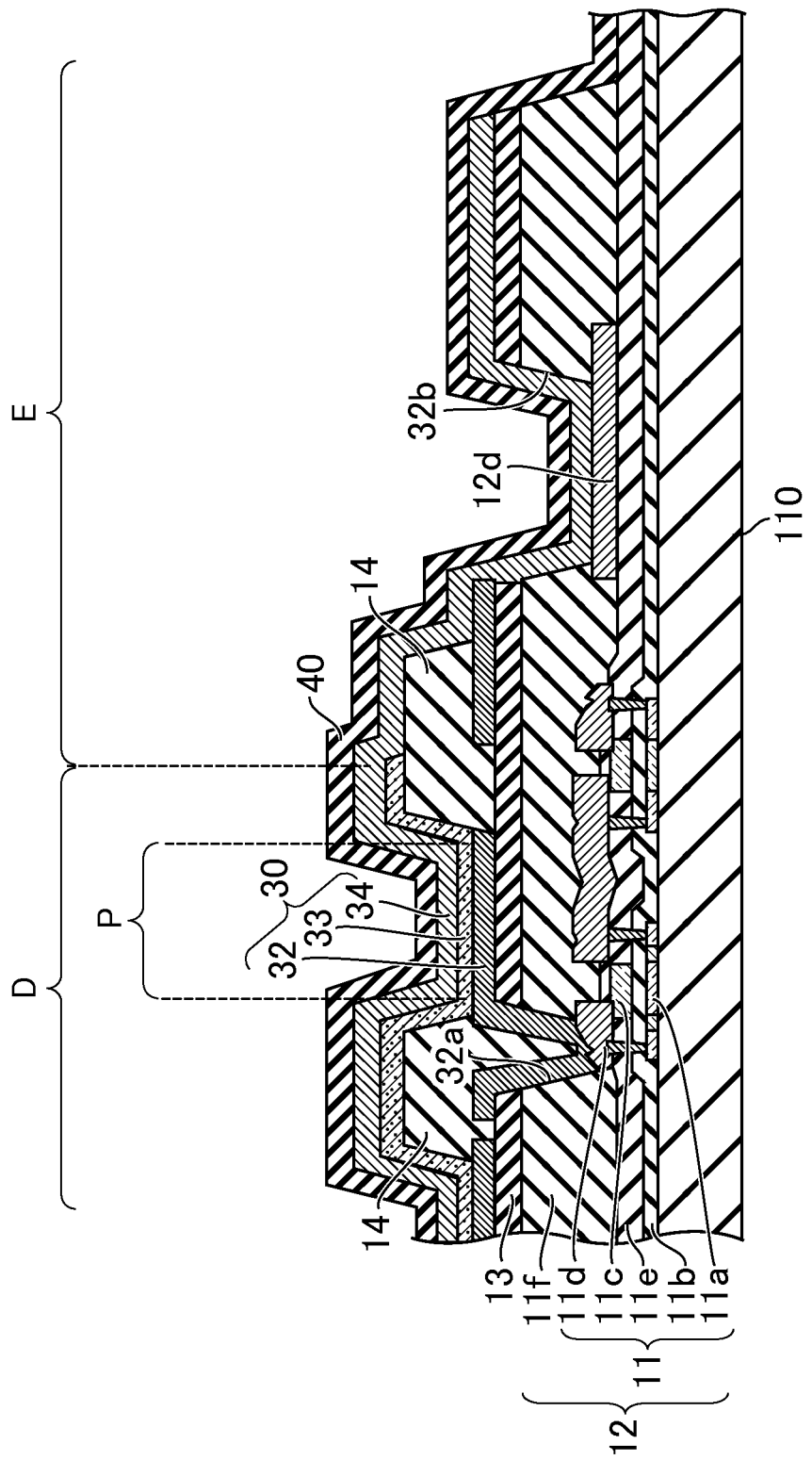
FIG. 6 is a schematic cross-sectional view showing the mother substrate shown in FIG. 1 in the same view as FIG. 3, showing the method of manufacturing the organic electroluminescent display device according to the embodiment of the invention.

Next, the upper electrode 34 is formed on the organic layer 33 using the mask 200. FIG. 5 is a schematic cross-sectional view showing the mother substrate 110 shown in FIG. 1 in the same view as FIG. 2, showing the method of manufacturing the organic electroluminescent display device according to the embodiment of the invention. FIG. 6 is a schematic cross-sectional view showing the mother substrate 110 shown in FIG. 1 in the same view as FIG. 3, showing the method of manufacturing the organic electroluminescent display device according to the embodiment of the invention.

Specifically, the mask 200 is arranged on the mother substrate 110, and a light-transmissive, conductive material such as ITO, for example, is vapor-deposited in a state where the terminal forming regions T are covered with the shielding portions 204. A method of forming the upper electrode 34 is not limited to vapor deposition, and other method such as a sputtering method may be used.

Due to this, the upper electrode 34 is formed over the plurality of display regions D. Moreover, as shown in FIG. 5, the upper electrode 34 is not formed in the terminal forming region T, so that the first wire L remains exposed from the upper electrode 34. Thus, as shown in FIG. 6, the organic electroluminescent light-emitting element 30 is formed.

Next, the mask 200 is removed from the mother substrate 110, and a sealing film 40 formed of, for example, silicon nitride (SiN) is formed so as to cover the display region D, the non-display region E, and the terminal forming region T. Due to this, as shown in FIG. 5, the upper electrode 34 in the display region D and the terminal 21 in the terminal forming region T are covered with the sealing film 40.

Figure 7:
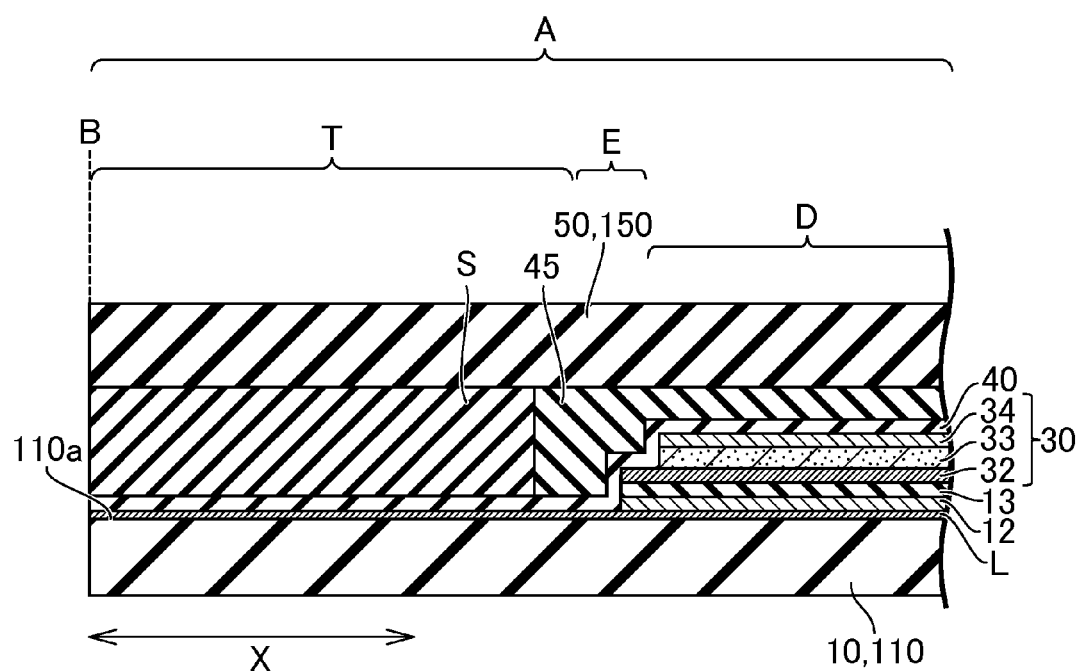
FIG. 7 is a schematic cross-sectional view showing the mother substrate shown in FIG. 1 in the same view as FIG. 2, showing the method of manufacturing the organic electroluminescent display device according to the embodiment of the invention.
Figure 8:
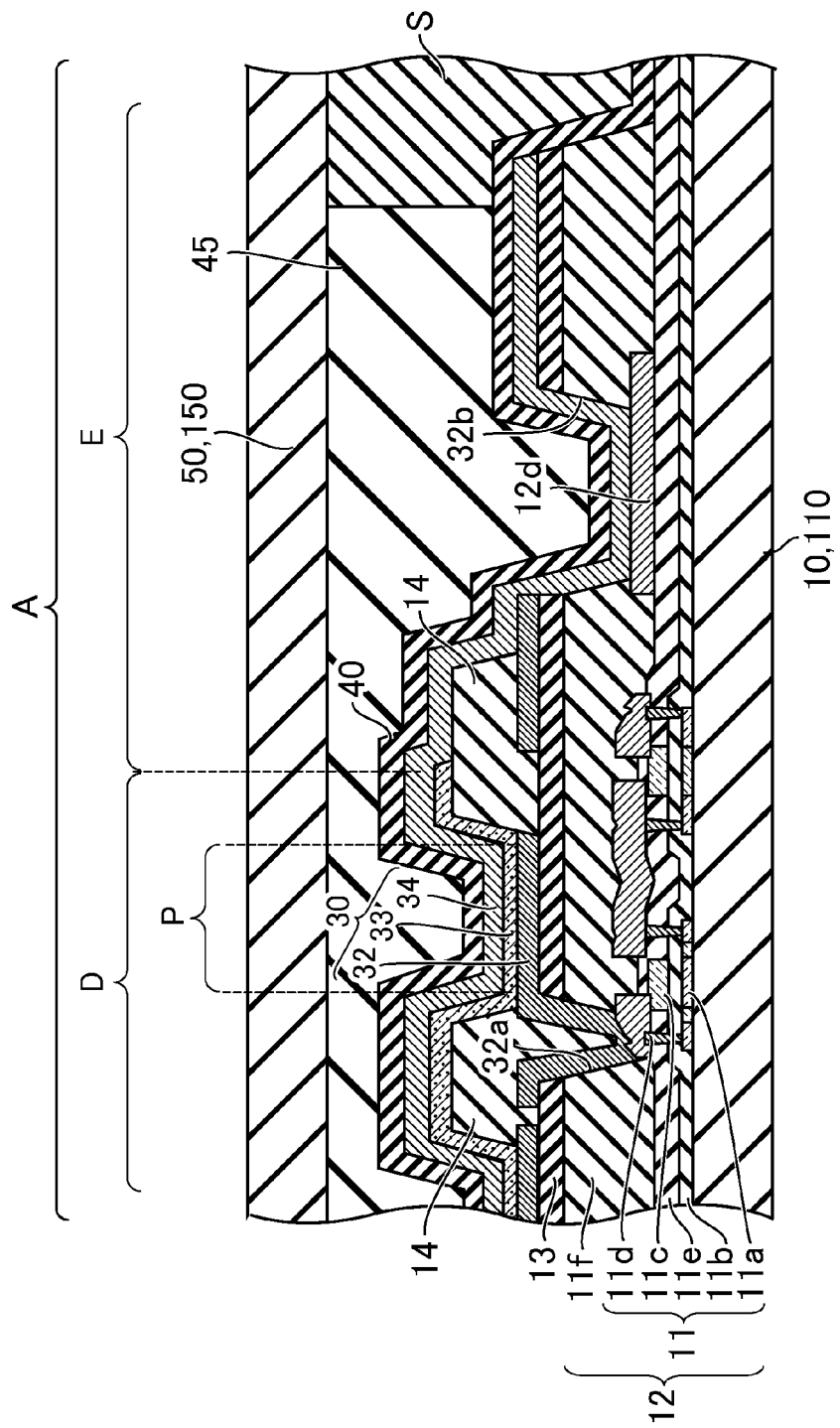
FIG. 8 is a schematic cross-sectional view showing the mother substrate shown in FIG. 1 in the same view as FIG. 3, showing the method of manufacturing the organic electroluminescent display device according to the embodiment of the invention.

FIG. 7 is a schematic cross-sectional view showing the mother substrate 110 shown in FIG. 1 in the same view as FIG. 2, showing the method of manufacturing the organic electroluminescent display device according to the embodiment of the invention. FIG. 8 is a schematic cross-sectional view showing the mother substrate 110 shown in FIG. 1 in the same view as FIG. 3, showing the method of manufacturing the organic electroluminescent display device according to the embodiment of the invention.

Next, a sealing material S is arranged on the sealing film 40 so as to surround an outer periphery of each of the organic electroluminescent display device forming regions A. Next, the inside of a region surrounded by the sealing material S is filled with an filling material 45. Next, a counter mother substrate 150 is arranged so as to cover an upper surface of the sealing film 40 via the filling material 45. The counter mother substrate 150 is composed of, for example, a plurality of counter substrates 50 such as color filter substrates that are contiguous to each other.

Next, the counter mother substrate 150 and the mother substrate 110 are cut along the borders B to thereby be divided into a plurality of individual pieces (the counter substrates 50 and substrates 10).

Figure 9:
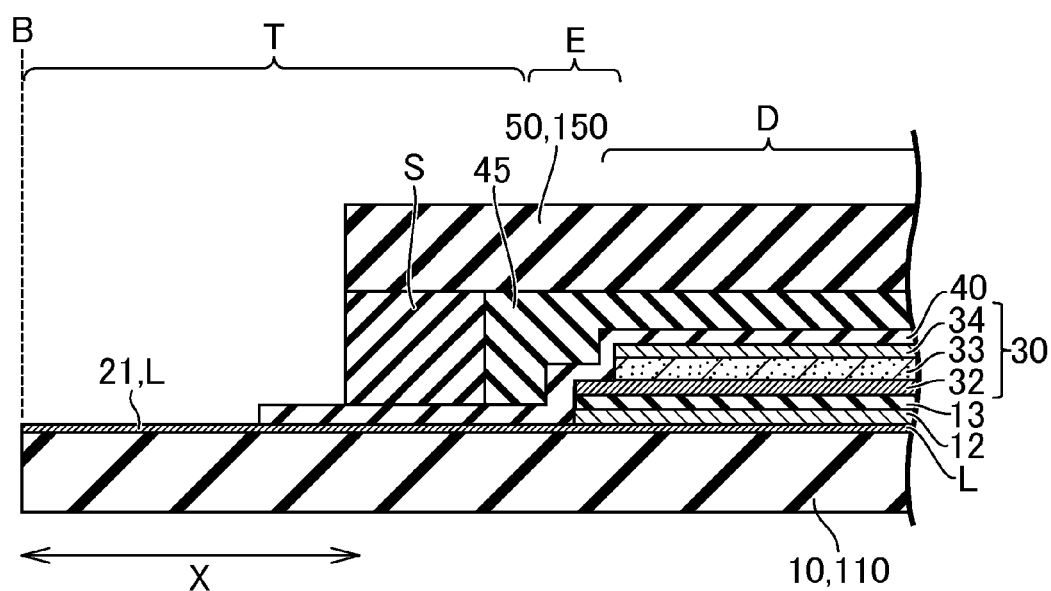
FIG. 9 is a schematic cross-sectional view showing the mother substrate shown in FIG. 1 in the same view as FIG. 2, showing the method of manufacturing the organic electroluminescent display device according to the embodiment of the invention.

Next, portions of the counter substrate 50, the sealing material S, and the sealing film 40 are removed in the terminal forming region T to expose the terminal 21. FIG. 9 is a schematic cross-sectional view showing the mother substrate 110 shown in FIG. 1 in the same view as FIG. 2, showing the method of manufacturing the organic electroluminescent display device according to the embodiment of the invention.

Figure 10:
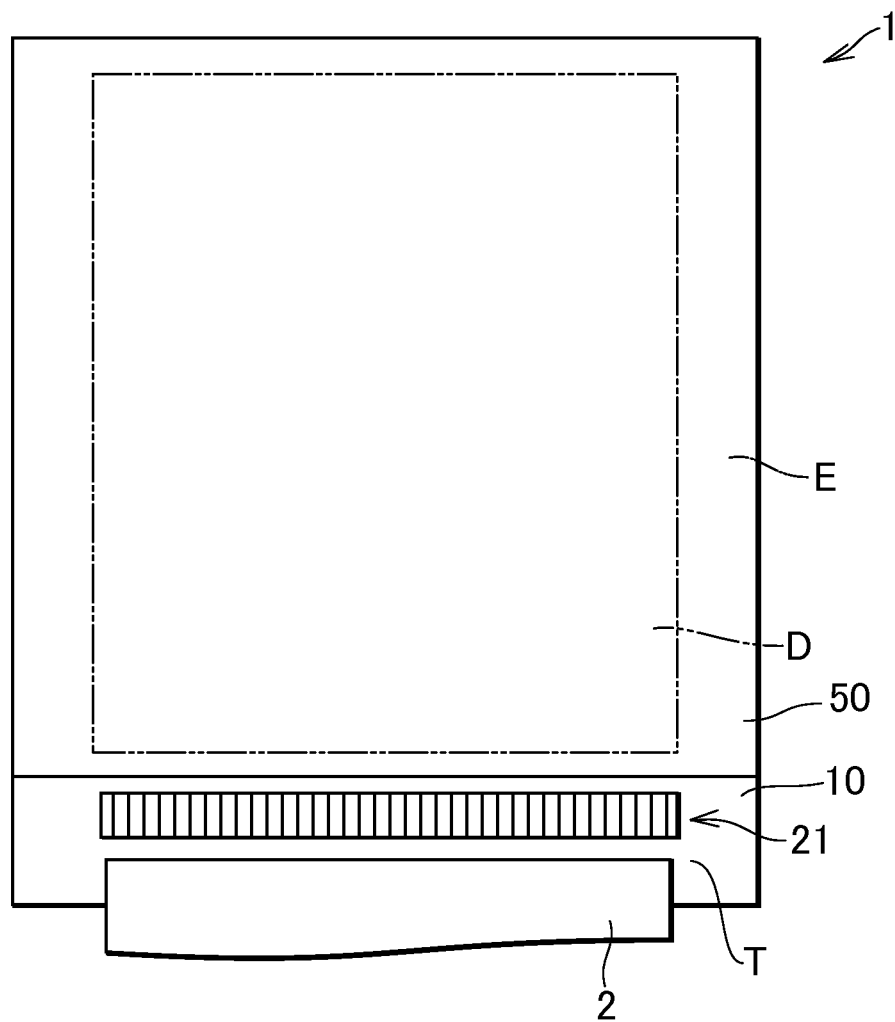
FIG. 10 is a schematic plan view showing an organic electroluminescent display device manufactured by the method of manufacturing the organic electroluminescent display device according to the embodiment of the invention.

FIG. 10 is a schematic plan view showing an organic electroluminescent display device 1 manufactured by the method of manufacturing the organic electroluminescent display device 1 according to the embodiment of the invention. After exposing the terminal 21, a flexible circuit board 2 is provided on the substrate 10, whereby the organic electroluminescent display device 1 is manufactured.

In the method of manufacturing the organic electroluminescent display device 1 in the embodiment, the shielding portion 204 of the mask 200 extends only in one direction (the direction Y) in the state where the tension in the one direction Y is applied. For this reason, even when a material of the upper electrode 34 adheres to the shielding portion 204 in the step of depositing the material of the upper electrode 34, the shielding portion 204 is prevented from deforming due to a film stress of the material of the upper electrode 34.

For this reason, the occurrence of failure due to the shielding portion 204 contacting the mother substrate 110 or the upper electrode 34 is suppressed in the organic electroluminescent display device 1, so that a manufacturing method providing high yield can be realized.

Moreover, in the mask 200 in the embodiment, since the shielding portion 204 extends only in one direction (the direction Y), a reduction in the accuracy of the shape of the opening 202b caused by the tension applied to the shielding portion 204 is suppressed. For this reason, the tension to be applied to the shielding portion 204 can be more increased than a manufacturing method not having the configuration. Due to this, in the method of manufacturing the organic electroluminescent display device 1 in the embodiment, the deformation of the shielding portion 204 is suppressed, so that improvement in yield can be realized.

The embodiment of the invention has been described so far, but the invention is not limited to the embodiment described above. For example, the configuration described in the embodiment described above may be replaced with substantially the same configuration, a configuration providing the same operational effect, or a configuration capable of achieving the same object.

For example, the plurality of shielding portions 204 of the mask 200 may not be separated from each other as long as the shielding portion extends only in one direction (the Y-direction in the embodiment) inside the inner periphery 202b of the frame 202 in the plan view.

Figure 11:
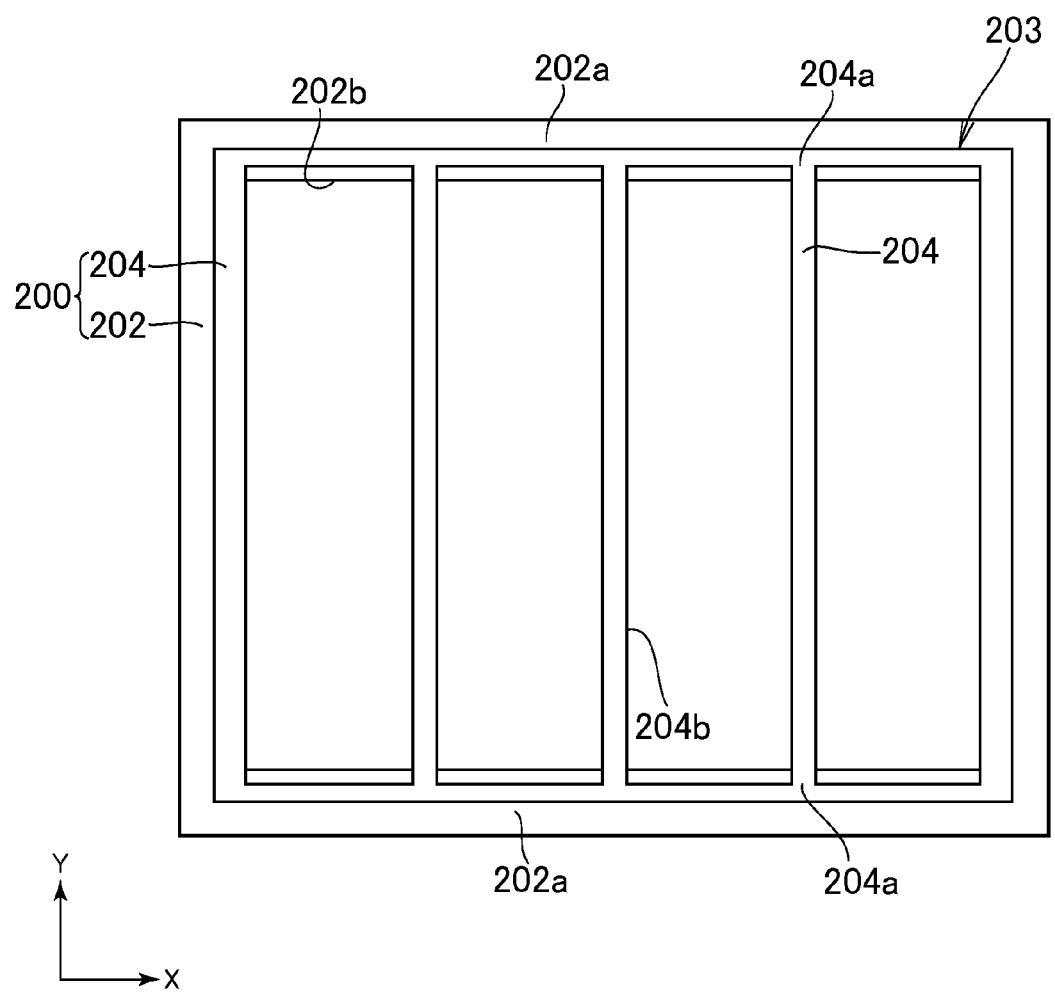
FIG. 11 is a schematic plan view showing a modified example of a mask for depositing the upper electrode on the mother substrate.

FIG. 11 is a schematic plan view showing a modified example of a mask for depositing the upper electrode on the mother substrate. Specifically for example, as shown in FIG. 11, the shielding portion 204 may be formed by providing openings 204b that extend in one direction (the Y-direction in the embodiment) in a shielding member 203 such as, for example, metal foil.

Since the method of manufacturing the organic electroluminescent display device 1 in the modified example has the configuration described above, the positional displacement of the shielding portions 204 can be prevented compared to a manufacturing method not having the configuration. For this reason, a manufacturing method providing high yield can be realized.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A method of manufacturing an organic electroluminescent display device comprising the steps of:
    forming, on a mother substrate in which organic electroluminescent display device forming regions each including a display region and a terminal forming region are arranged in a matrix, a thin film transistor in the display region;
    forming a lower electrode on the thin film transistor;
    forming, on the lower electrode, an organic layer including a light-emitting layer;
    forming an upper electrode on the organic layer; and
    cutting the mother substrate along a border between the organic electroluminescent display device forming regions to thereby divide the mother substrate into a plurality of individual pieces,
    wherein
    the step of forming the upper electrode comprises depositing a material of the upper electrode in the display region using a mask including a frame and a stripe-shaped shielding portion that covers a region corresponding to the terminal forming region, and the shielding portion is provided in a state where the shielding portion spans between facing sides of th frame and extends only in one direction inside an inner periphery of the frame in a plan view, with tension only in the one direction applied to the shielding portion.

2. The method of manufacturing the organic electroluminescent display device according to claim 1, wherein
the shielding portion is formed by providing openings that extend in the one direction in a shielding member.

\* \* \* \* \*